(12) United States Patent
Knowles (10) Patent No.: US 6,640,311 B1
(45) Date of Patent: Oct. 28, 2003

(54) REDUNDANT OSCILLATOR AND METHOD FOR GENERATING A REGULATED SIGNAL

(75) Inventor: Kenneth R. Knowles, Manassas, VA (US)

(73) Assignee: BAE Systems Information and Electronic Systems Integration, Inc., Manassas, VA (US)

( * ) Notice: Subject to any disclaimer, the term of this patent is extended or adjusted under 35 U.S.C. 154(b) by 470 days.

(21) Appl. No.: 09/636,125

(22) Filed: Aug. 10, 2000

(51) Int. Cl.[7] ............................. G06F 1/08; H03D 13/00
(52) U.S. Cl. .............................. 713/501; 327/7; 331/48
(58) Field of Search .................................. 713/500, 501; 327/1–3, 7, 100, 144, 147–150; 331/46–56

(56) References Cited

U.S. PATENT DOCUMENTS

| 5,111,429 A | 5/1992 | Whitaker |
| 5,175,605 A | 12/1992 | Pavlu et al. |
| 5,311,070 A | 5/1994 | Dooley |
| 5,406,513 A | 4/1995 | Canaris et al. |
| 5,504,703 A | 4/1996 | Bansal |
| 5,559,461 A | 9/1996 | Yamashina et al. |
| 5,764,089 A | 6/1998 | Partovi et al. |
| 5,870,332 A | 2/1999 | Lahey et al. |

OTHER PUBLICATIONS

IBM Corp., On–Chip Receiver Featuring Fall–Through Radiation–Hardened Latching, IBM Technical Disclosure Bulletin, vol. 32, No. 12, May 1990, pp. 389–392.

*Primary Examiner*—Thomas M. Heckler
(74) *Attorney, Agent, or Firm*—Daniel J. Long; Graybeal Jackson Haley LLP (57) ABSTRACT

A circuit includes a signal generator and a discriminator. The signal generator generates a plurality of reference signals where a majority of the reference signals have the same phase. The discriminator generates a regulated signal that has the same phase as the majority of the reference signals. Therefore, if an environmental disturbance such as a single-event transient (SET) shifts the phase or phases of a minority of the reference signals, the discriminator maintains the regulated signal at a stable frequency and phase by generating the regulated signal with reference to the undisturbed majority of the reference signals.

28 Claims, 6 Drawing Sheets

REDUNDANT OSCILLATOR AND METHOD FOR GENERATING A REGULATED SIGNAL

TECHNICAL FIELD

The invention relates generally to electronic circuits, and more particularly to a redundant oscillator and method for generating a phase-regulated signal. For example, such an oscillator may generate a regulated signal having the same phase as a majority of multiple reference signals. Therefore, a phase shift in a minority of the reference signals does not affect the phase of the regulated signal.

BACKGROUND OF THE INVENTION

Integrated circuits (ICs) that operate in harsh environments such as outer space may temporarily or permanently fail in response to an environmental disturbance such as radiation. For example, a single-event transient (SET) is defined as a charged particle striking a circuit node inside an IC. Typically, the charged particle imparts a temporary charge to the circuit node, and this charge may temporarily affect the phase, frequency, amplitude, or other parameter of a signal that propagates through the node. Depending on the function, path, and affected parameter of the signal, one or more circuits within the IC may temporarily or permanently fail, thus causing the IC itself to fail. For example, a temporary shift in the phase of a data clock may force a data circuit out of synchronization with other circuits, and thus may cause the IC to generate erroneous data.

SUMMARY OF THE INVENTION

In one aspect of the invention, a circuit includes a signal generator and a discriminator. The signal generator generates a plurality of reference signals where at least a majority of the reference signals have the same phase. The discriminator generates a regulated signal that has the same phase as the majority of the reference signals. For example, a redundant oscillator circuit can have a signal generator that generates three reference signals all having the same phase and frequency. Therefore, if a disturbance such as an SET temporarily shifts the phase or phases of a minority of the reference signals, the phase of the regulated signal does not shift because the discriminator references the regulated signal to the undisturbed majority of the reference signals.

DETAILED DESCRIPTION OF THE INVENTION

Figure 1:
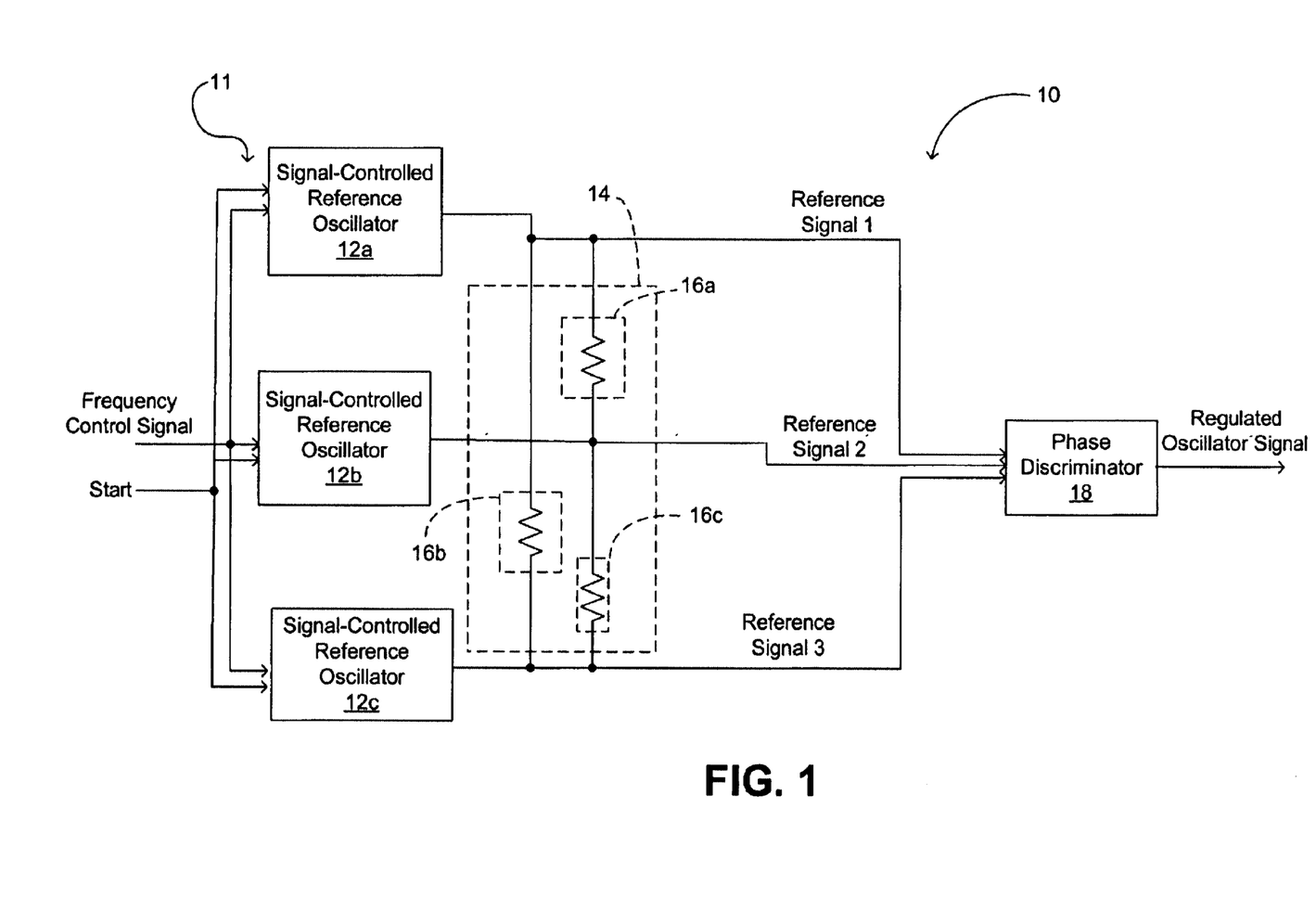
FIG. 1 is a block diagram of a redundant oscillator according to an embodiment of the invention.

FIG. 1 is a block diagram of a redundant oscillator 10 according to an embodiment of the invention. In one embodiment, an IC designed to be used in harsh environments such as outer space includes the oscillator 10, which generates a stable clock signal for clocked circuits on the IC.

Generally, the oscillator 10 generates a regulated oscillator signal such that it has the same phase as at least a majority of a plurality of reference signals. Therefore, if the phase or phases of a minority of the reference signals is shifted in response to an environmental disturbance such as an SET, the phase of the regulated oscillator signal is unaffected by the disturbance. Thus, the oscillator 10 prevents environmental disturbances from adversely affecting the operation of other circuits to which it provides the oscillator signal.

In one embodiment, the redundant oscillator 10 includes a signal generator 11, which includes three reference oscillators 12a–12c. The oscillators 12a–12c generate respective reference signals 1, 2, and 3. In the illustrated embodiment, the oscillators 12a–12c are conventional signal-controlled oscillators that begin oscillating in response to a start signal and that respectively generate the reference signals at frequencies proportional to the voltage or other parameter of a frequency-control signal. Although described as including three reference oscillators 12a–12c, the oscillator 10 may include any number of reference oscillators 12 sufficient to allow the oscillator 10 to generate the regulated oscillator signal. The reference oscillators 12a–12c are discussed in more detail below in conjunction with FIG. 2.

The redundant oscillator 10 also includes a coupling circuit 14 for synchronizing the oscillators 12a–12c to one another such that after a startup transient period, the reference signals 1, 2, and 3 have the same frequency and phase as one another. The circuit 14 includes coupling elements 16a–16c, which in one embodiment are 20 kΩ resistors that are coupled between the output terminals of the reference oscillators 12a–12c in a delta configuration. In other embodiments, however, the coupling elements 16a–16c may have a different impedance value, may each include other types of impedance elements such as capacitors, transistors, or diodes, or may be coupled in other configurations such as a wye configuration. In one embodiment, the impedances of the elements 16a–16c are matched to the respective output impedances of the reference oscillators 12a–12c—each approximately 20 kΩ in one embodiment—and these matched elements 16a–16c provide feedback that synchronizes the oscillators 12a–12c to one another. Because the oscillators 12a–12c are typically disposed on the same IC and thus are typically well matched to one another, the elements 16a–16c can typically synchronize the oscillators 12a–12c within a relatively short time after startup.

In addition, the oscillator 10 includes a phase discriminator 18, which generates a regulated oscillator signal that is synchronized to at least a majority of the reference signals 1, 2, and 3. Engineers often call a circuit like the discriminator 18 a polling or voting circuit. As discussed below, the discriminator 18 maintains the frequency and phase of the regulated signal equal to the frequency and phase of at least a majority of the reference signals 1, 2, and 3. Therefore, if the amplitude, frequency, or phase of one of the reference signals is corrupted by an environmental disturbance or other event, the regulated signal is unaffected because the discriminator 18 synchronizes the regulated signal to the two uncorrupted reference signals. The discriminator 18 is discussed in more detail below in conjunction with FIG. 3.

Still referring to FIG. 1, in operation of the redundant oscillator 10, the discriminator 18 prevents disturbances to the reference oscillators 12a–12c from corrupting the frequency and phase of the regulated oscillator signal. In one embodiment, a circuit (not shown) generates the start signal, which allows the reference oscillators 12a–12c to begin oscillating approximately in phase with one another. After a relatively short transient period, the coupler 14 synchronizes the reference oscillators 12a–12c such that they generate the reference signals 1, 2, and 3 having the same frequency and phase. Also after this transient period, the discriminator 18 generates the regulated oscillator signal having the same frequency and phase as the synchronized reference signals 1, 2, and 3. If a disturbance shifts the amplitude, frequency, or phase of the reference signal 3, for example, then the discriminator 18 continues to generate the regulated signal having the same frequency and phase as the undisturbed reference signals 1 and 2. Therefore, because even in harsh environments the chances are small that more than one of the reference signals will be simultaneously disturbed, the frequency and phase of the regulated oscillator signal are virtually never corrupted.

Although the redundant oscillator 10 is described as having three reference oscillators 12a–12c, the oscillator 10 may have two or more reference oscillators—with the phase discriminator 18 having a corresponding number of input terminals—and be designed such that the discriminator 18 generates the regulated oscillator signal based on the reference signals that are unaffected by a disturbance. Furthermore, if the oscillator 10 includes more than three reference oscillators 12, the discriminator 18 can effectively regulate the oscillator signal even if a disturbance simultaneously shifts the frequency or phase of multiple reference signals, so long as the frequency and phase of a majority of the reference signals are undisturbed.

Figure 2:
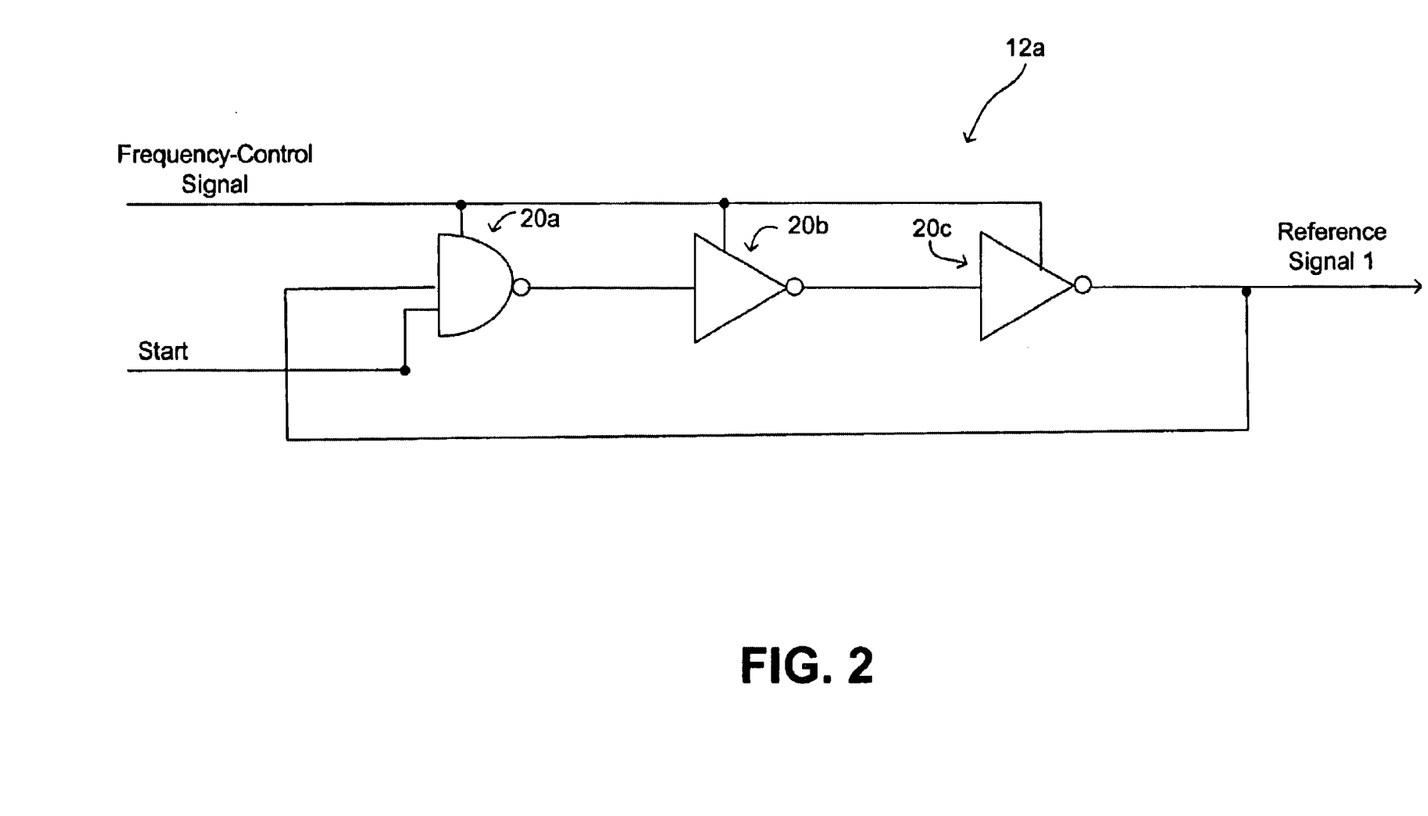
FIG. 2 is a schematic diagram of a reference oscillator of FIG. 1 according to an embodiment of the invention.

FIG. 2 is a schematic diagram of the reference oscillator 12a of FIG. 1 according to an embodiment of the invention, it being understood that the reference oscillators 12b and 12c may be the same as the reference oscillator 12a. In the illustrated embodiment, the oscillator 12a is a conventional ring oscillator that includes three serially coupled inverter stages 20a–20c. The frequency-control signal is coupled to a supply terminal of each stage 20a–20c, the start signal is coupled to one input terminal of the first stage 20a, and the output terminal of each stage is coupled to the input terminal of the following stage, with the output of the last stage 20c being coupled to the other input terminal of the first stage 20a. In the illustrated embodiment, the stage 20a is a two-input NAND gate and the stages 20b and 20c are inverters. In another embodiment, a stage other than 20a may be a NAND gate, or multiple stages 20 may be NAND gates. It is preferred, however, than only one stage 20 be the NAND gate to allow the frequency and phase of the oscillator 12a to settle more quickly. In yet another embodiment, the stage 20a may be or include another inverting component such as a NOR gate. In still another embodiment where the start signal is omitted, all of the stages 20a–20c my be inverters.

In operation, when the start signal is at a logic 0 voltage level, it disables the oscillator 12a from oscillating by forcing the output terminal of the NAND inverting stage 20a to logic 1 regardless of the voltage level on its other input terminal.

Conversely, when the start signal transitions to logic 1, it enables the oscillator 12a, which thus begins to oscillate. The speed of the stages 20a–20c, and thus the frequency at which the oscillator 12a oscillates, is proportional to the voltage level of the frequency-control signal. In one embodiment, during a power down mode of the circuit 10 of FIG. 1, the start signal can transition back to logic 0 to stop the oscillator 12a from oscillating and thus conserve power.

In another embodiment of the invention, the reference oscillator 12a is similar to the voltage-controlled ring oscillator disclosed in U.S. Provisional Patent Ser. No. 60/163, 757, entitled OSCILLATOR AND METHOD FOR GENERATING A FREQUENCY WITHIN A STABLE FREQUENCY RANGE, filed Nov. 5, 1999 and incorporated by reference. In another embodiment, the reference oscillator 12a is not frequency or startup controlled. In other embodiments, the oscillator 12a can be any other type of conventional Oscillator.

Figure 3:
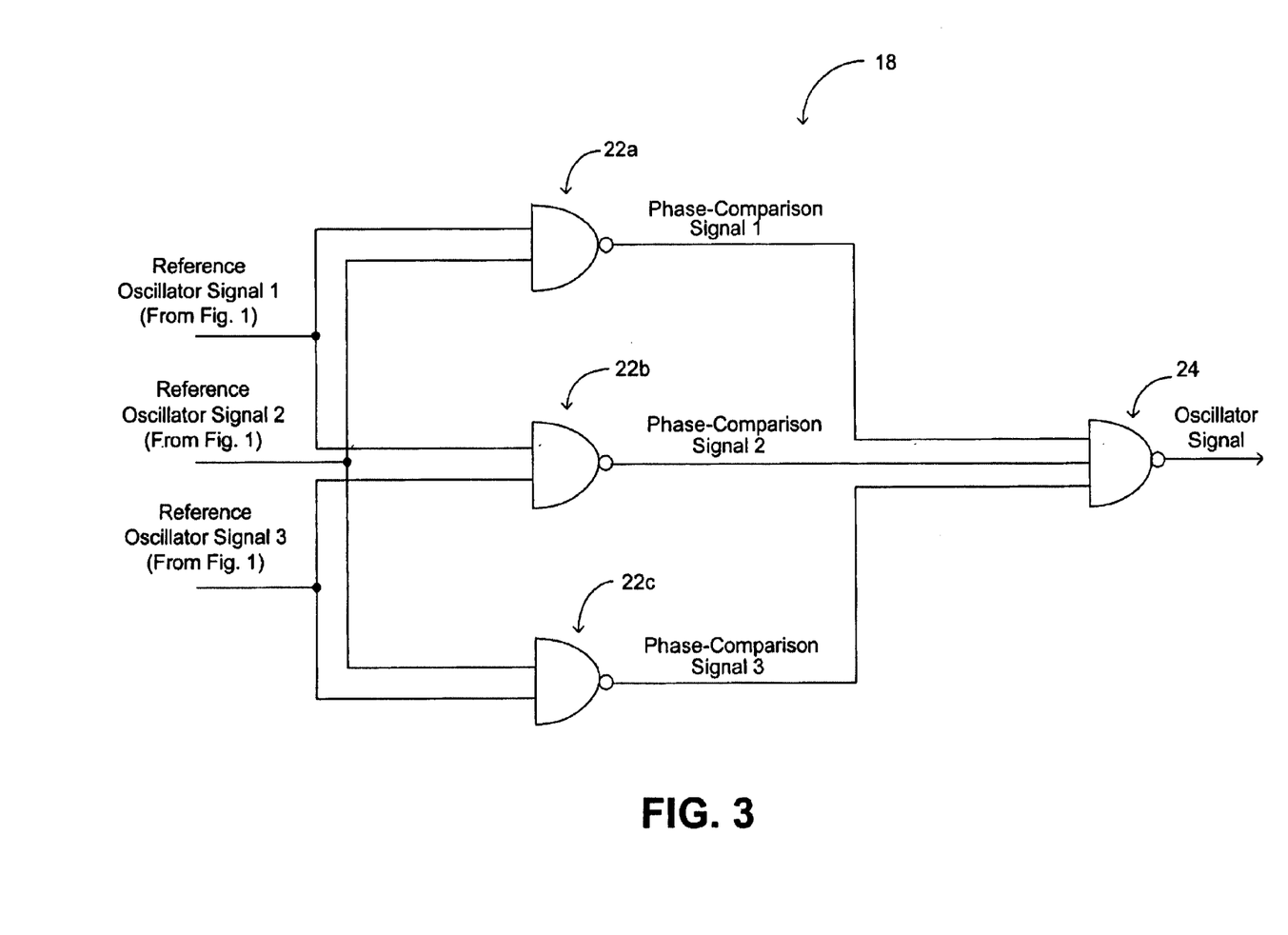
FIG. 3 is a schematic diagram of the phase discriminator of FIG. 1 according to an embodiment of the invention.

FIG. 3 is a schematic diagram of the signal discriminator 18 of FIG. 1 according to an embodiment of the invention. In the illustrated embodiment, the discriminator 18 is a conventional voting circuit that generates the regulated oscillator signal having the same frequency and phase as at least a majority of the reference signals 1, 2, and 3.

The discriminator 18 includes three phase comparators 22a–22c, which in the illustrated embodiment are respective two-input NAND gates. Together, the phase comparators 22a–22c compare the phases of each respective pair of the reference signals. Specifically, the comparator 22a compares the phases of the reference signals 1 and 2. Likewise, the comparator 22b compares the phases of the reference signals 1 and 3, and the comparator 22c compares the phases of the reference signals 2 and 3.

The discriminator 18 also includes a majority-phase detector 24, which in the illustrated embodiment is a three-input NAND gate. The detector 24 compares the phase comparison signals from the comparators 22a–22c and generates the regulated oscillator signal having the same frequency and phase as the majority, which in this case is two or three, of the reference signals 1, 2, and 3.

Figure 4:
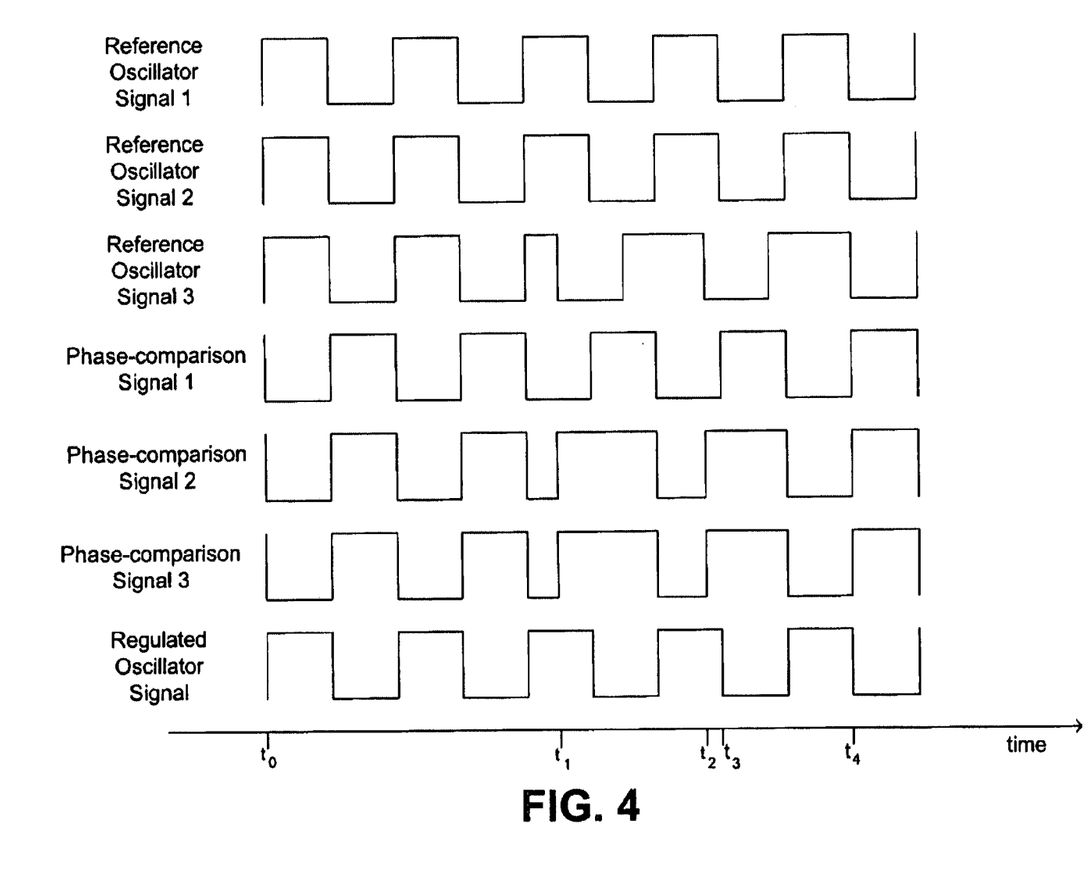
FIG. 4 is a timing diagram of the signals of FIG. 3 according to an embodiment of the invention.

Referring to FIGS. 3 and 4, the operation of the discriminator 18 is discussed according to an embodiment of the invention.

FIG. 4 is a timing diagram of the signals in FIG. 3 according to an embodiment of the invention. For example purposes, the reference signals 1, 2, and 3 are represented, when undisturbed, as square waves having 50% duty cycles, although the reference signals may be other types of wave forms and have other shapes. Furthermore, initial time $t_0$ is after the coupler circuit 14 (FIG. 1) has synchronized the reference oscillators 12a–12c (FIG. 1) such that the reference signals 1, 2, and 3 have the same frequency and phase, i.e., the transitions of the reference signals are aligned.

Referring to FIG. 4, from time $t_0$ to time $t_1$ the reference signals are synchronized, and thus have the same frequency and phase as one another. Therefore, each of the phase-comparison signals 1, 2, and 3 is 180° out of phase with the reference signals, and the regulated oscillator signal has the same frequency and phase as each of the reference signals.

Between times $t_1$ and $t_4$, an environmental or other disturbance temporarily shifts the frequency and phase of only the reference signal 3. But because the disturbance does not affect the reference signals 1 and 2, it does not affect the regulated oscillator signal. Specifically, the reference signals 1 and 2 together constitute an undisturbed majority of the reference signals. Because the reference signals 1 and 2 are undisturbed, the phase-comparison signal 1 from the phase comparator 22a is unaffected, and thus remains 180° out of phase with respect to the majority reference signals 1 and 2. Conversely, because the reference signals 3 is disturbed, the phase-comparison signals 2 and 3 are each frequency and phase shifted as shown. But the regulated oscillator signal remains 180° out of phase with the undisturbed phase-comparison signal 1 and in phase with the undisturbed majority reference signals 1 and 2. Thus, the frequency and phase of the regulated oscillator signal are unaffected by the disturbance.

Still referring to FIGS. 3 and 4, although described for the case when the reference signal 3 is disturbed, a similar analysis yields an undisturbed regulated oscillator signal when either the reference signal 1 or 2 is disturbed. Of course, if more than one of the reference signals are simultaneously disturbed, then, in the illustrated embodiment of the discriminator 18, the regulated oscillator signal is disturbed as well. But statistically speaking, virtually all disturbances will simultaneously shift the phase and frequency of no more than one of the reference signals. Thus, disturbances in the regulated oscillator signal are virtually nonexistent. In addition, as discussed above, generating more than three reference signals and modifying the discriminator 18 accordingly protects the regulated oscillator signal from a disturbance even if the disturbance affects multiple reference signals, so long as the disturbed reference signals together constitute no more than a minority of the reference signals.

Referring again to FIG. 3, although the discriminator 18 is described as including NAND phase comparators and a NAND phase detector 24, the discriminator 18 may be any logic or other type of circuit that performs the phase-discrimination function described above. For example, applying the well-known DeMorgan's theorem to the discriminator 24 allows one to replace the three-input NAND gate with a three-input OR gate and replace the two-input NAND gates with respective AND gates.

Figure 5:
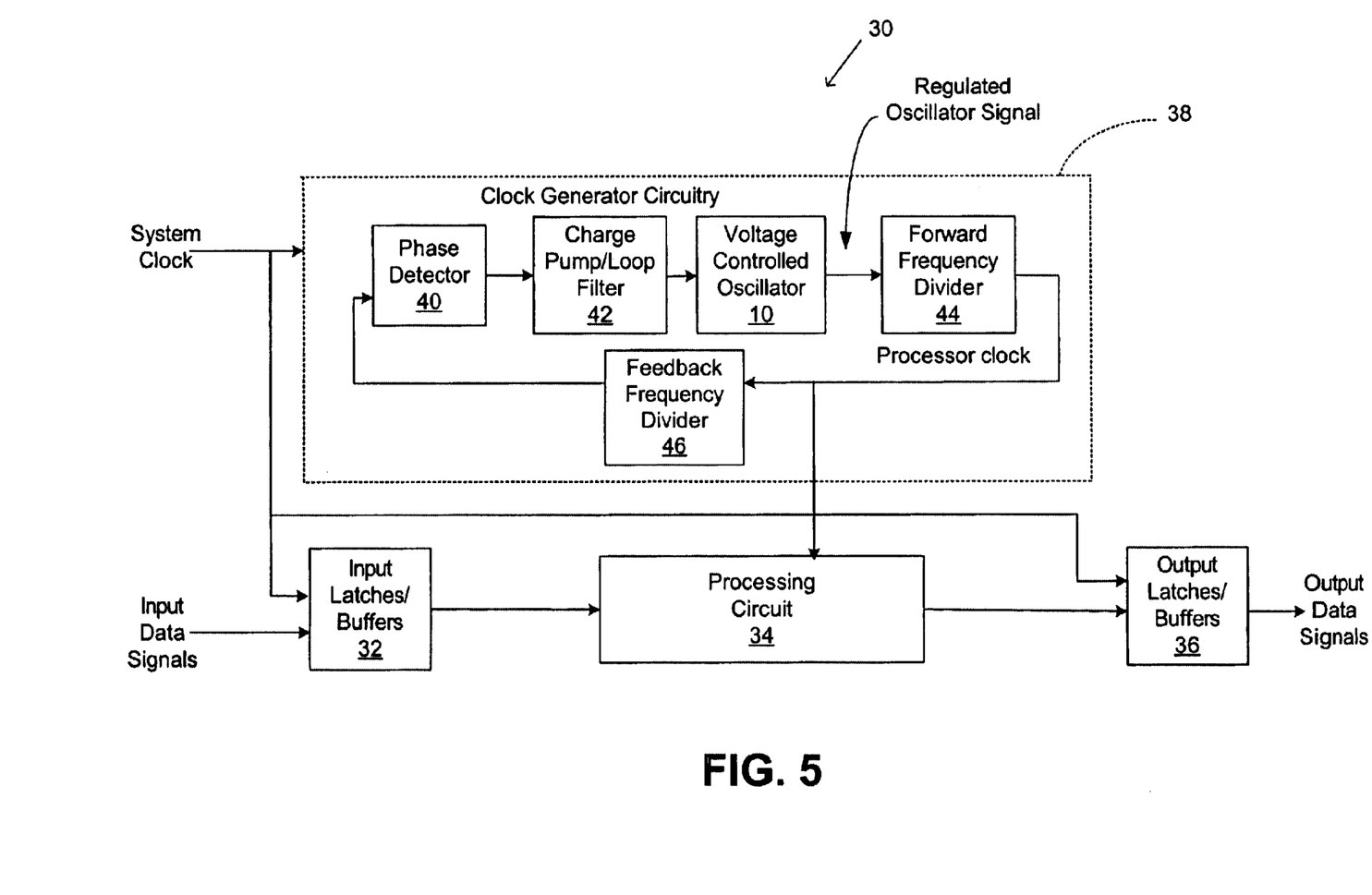
FIG. 5 is a block diagram of a processor that includes a version of the redundant oscillator of FIG. 1 according to an embodiment of the invention.

FIG. 5 is a block diagram of a processor 30, which includes a voltage-controlled version of the redundant oscillator 10 of FIG. 1 according to an embodiment of the invention. The processor 30 includes a bank 32 of conventional input latches and buffers for receiving and latching input data signals, a conventional processing circuit 34 for manipulating the input data signals, and a bank 36 of conventional output latches and buffers for latching the output data signals generated by the processing circuit 34 and for providing these output data signals to other circuitry (not shown in FIG. 5). In one embodiment, the processing circuit 34 includes an Arithmetic Logic Unit (ALU) coupled to a cache memory (both not shown). The processor 30 also includes a phase-locked loop (PLL) 38 for generating a PROCESSOR CLOCK signal from a SYSTEM CLOCK signal. The PLL 38 includes a conventional phase detector 40 for generating an error signal that is proportional to the phase difference between SYSTEM CLOCK and PROCESSOR CLOCK or a derivative thereof. A conventional charge pump/loop filter 42 filters the error signal and generates the frequency-control voltage that controls the frequency of the regulated oscillator signal from the oscillator 10. To allow PROCESSOR CLOCK to have a lower frequency than the oscillator signal and an approximately 50% duty cycle, an optional and conventional forward frequency divider 44 generates PROCESSOR CLOCK at a lower frequency than the oscillator signal. To allow SYSTEM CLOCK to have a lower frequency than PROCESSOR CLOCK, an optional and conventional feedback frequency divider 46 reduces the frequency of PROCESSOR CLOCK to that of SYSTEM CLOCK.

Figure 6:
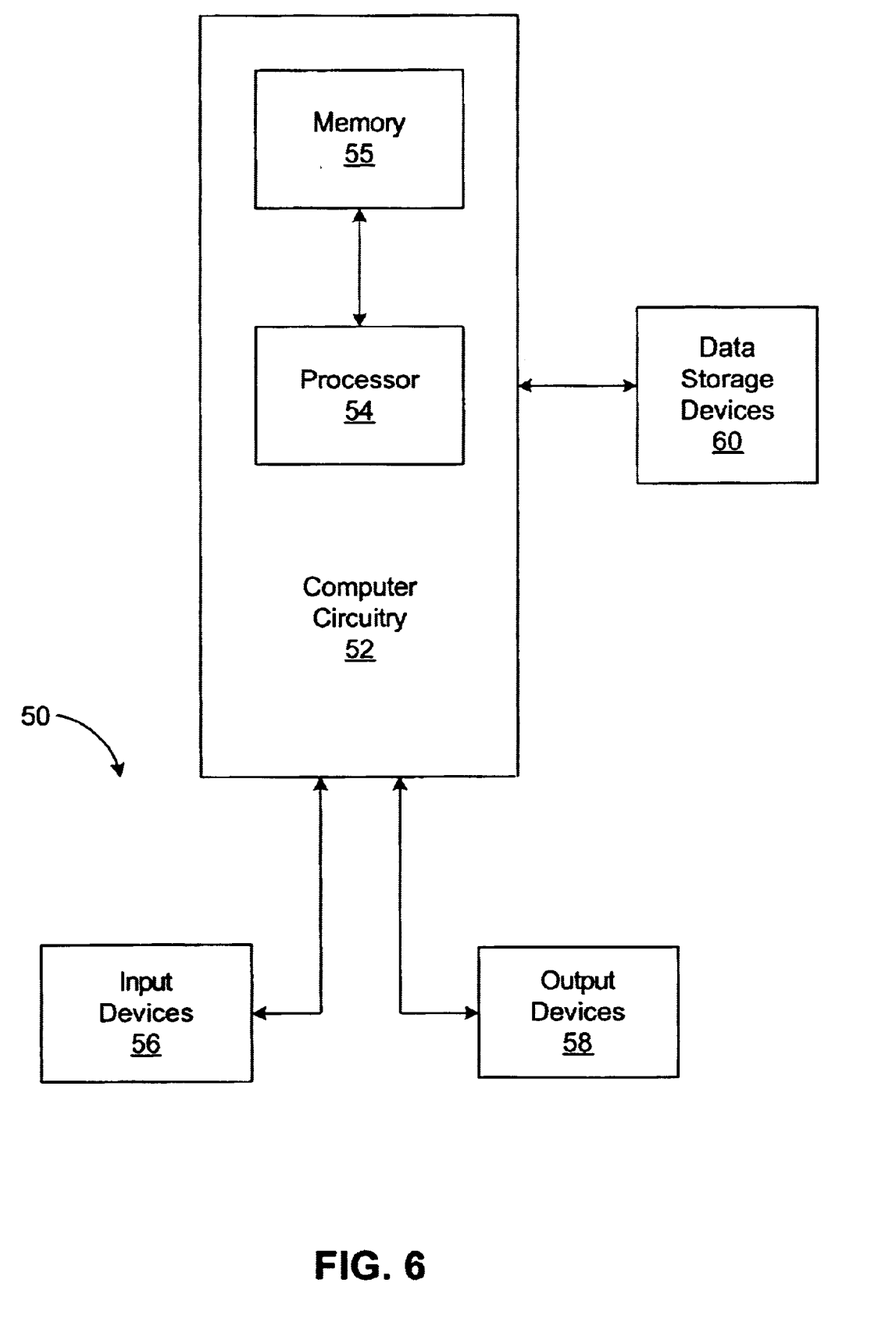
FIG. 6 is a block diagram of an electronic computer system that includes the processor of FIG. 5 according to an embodiment of the invention.

FIG. 6 is a block diagram of an electronic system 50, such as a computer system, that includes the processor 30 of FIG. 5 according to an embodiment of the invention. The system 50 includes computer circuitry 52 for performing computer functions, such as executing software to perform desired calculations and tasks. The circuitry 52 typically includes the processor 54 and a memory circuit 55, which is coupled to the processor 54. One or more input devices 56, such as a keyboard or a mouse, are coupled to the computer circuitry 52 and allow an operator (not shown) to manually input data thereto. One or more output devices 58 are coupled to the computer circuitry 52 to provide to the operator data generated by the computer circuitry 52. Examples of such output devices 58 include a printer and video display unit. One or more data-storage devices 60 are coupled to the computer circuitry 52 to store data or retrieve data from external storage media (not shown). Examples of the storage devices 60 and the corresponding storage media include drives that accept hard and floppy disks, tape cassettes, and compact disk read-only memories (CD-ROMs). Typically, the computer circuitry 52 includes address data and command buses and a clock line (not shown) that are respectively coupled to the memory circuit 55.

From the foregoing it will be appreciated that, although specific embodiments of the invention have been described herein for purposes of illustration, various modifications may be made without deviating from the spirit and scope of the invention.

What is claimed is:

1. A circuit, comprising:
    a signal generator;
    a discriminator coupled to the signal generator;
    wherein the signal generator is operable to generate a plurality of reference signals such that a majority of the reference signals have the same phase;
    and wherein the discriminator is operable to generate a phase-regulated signal having the same phase as the majority of the reference signals.

2. The circuit of claim 1 wherein the signal generator is operable to generate all of the plurality of reference signals having the same frequency and phase absent a disturbance that may shift the phases of a minority of the reference signals with respect to the phases of the majority of the reference signals.

3. The circuit of claim 1 wherein the signal generator comprises:
    a plurality of oscillators;
    a coupler coupled to the oscillators;
    wherein each of the oscillators is operable to generate a respective one of the reference signals; and
    wherein the coupler is operable to cause the oscillators to generate the reference signals having the same frequency and phase.

4. The circuit of claim 1 wherein the signal generator comprises a plurality of oscillators, wherein each oscillator is operable to generate a respective one of the reference signals and to receive a start signal that causes the oscillators to begin oscillating simultaneously.

5. The circuit of claim 1 wherein the signal generator comprises a plurality of oscillators, wherein each oscillator is operable to receive a frequency-control signal and to generate a respective one of the reference signals having a frequency that is proportional to the frequency-control signal.

6. The circuit of claim 1 wherein the signal discriminator comprises:
    a plurality of phase comparators;
    a majority-signal detector coupled to the phase comparators;
    wherein each phase comparator is operable to compare the phases of a respective pair of the reference signals and to generate a corresponding phase-comparison signal; and wherein the majority-signal detector is operable to generate the phase-regulated signal from the phase-comparison signals.

7. A circuit, comprising:

a signal generator;

a phase discriminator coupled to the signal generator;

wherein the signal generator is operable to generate first and second reference signals each having respective zero crossings; and wherein the phase discriminator is operable to generate a phase-regulated signal having zero crossings that periodically coincide with the zero crossings of one of the first and second reference signals.

8. The circuit of claim 7 wherein the signal generator is operable to generate the first and second reference signals having coinciding zero crossings.

9. The circuit of claim 7 wherein the signal generator is operable to generate the first and second reference signals having the same frequency.

10. The circuit of claim 7 wherein:

the signal generator is operable to generate the first and second reference signals having coinciding zero crossings absent a stimulus that may shift the zero crossings of one the first and second reference signals with respect to the zero crossings of the other of the first and second reference signals; and if the stimulus shifts the zero crossings of one of the reference signals, the phase discriminator is operable to generate the phase-regulated signal such that the zero crossings of the phase-regulated signal coincide or approximately coincide with the zero crossings of the unshifted reference signal.

11. A circuit, comprising:

a periodic-signal generator having first, second, and third signal output terminals; and a phase discriminator having a phase-regulated-signal output terminal and having first, second, and third reference input terminals respectively coupled to the output terminals of the periodic-signal generator.

12. The circuit of claim 11 wherein the periodic-signal generator comprises first, second, and third oscillators respectively coupled to the first, second, and third signal output terminals.

13. The circuit of claim 11 wherein the periodic-signal generator comprises:

first, second, and third oscillators having output terminals that are respectively coupled to the first, second, and third signal output terminals;

a first impedance element coupled between the output terminals of the first and second oscillators;

a second impedance element coupled between the output terminals of the second and third oscillators; and a third impedance element coupled between the output terminals of the first and third oscillators.

14. The circuit of claim 11 wherein the periodic-signal generator comprises first, second, and third oscillators, each oscillator comprising:

an oscillator output terminal coupled to a respective one of the first, second, and third signal output terminals;

a first inverter stage having an oscillator-signal input terminal, a start-up input terminal, and an output terminal;

a second inverter stage having oscillator-signal and start-up input terminals that are respectively coupled to the output terminal and the start-up input terminal of the first inverter stage, the second inverter stage also having an output terminal; and a third inverter stage having oscillator-signal and start-up input terminals that are respectively coupled to the output terminal and the start-up input terminal of the second inverter stage, the third inverter stage also having an output terminal coupled to the oscillator output terminal.

15. The circuit of claim 11 wherein the phase discriminator comprises:

a first logic gate having a first and second input terminals respectively coupled to the first and second signal output terminals of the signal generator, the first logic gate also having an output terminal;

a second logic gate having first and second input terminals respectively coupled to the second and third output terminals of the signal generator, the second logic gate also having an output terminal;

a third logic gate having first and second input terminals respectively coupled to the first and third output terminals of the signal generator, the third logic gate also having an output terminal; and a fourth logic gate having first, second, and third input terminals respectively coupled to the output terminals of the first, second and third logic gates, the fourth logic gate also having an output terminal coupled to the phase-regulated-signal output terminal.

16. The circuit of claim 11 wherein:

the periodic-signal generator comprises first, second, and third oscillators respectively coupled to the first, second, and third signal output terminals; and the phase discriminator comprises:

a first NAND gate having a first and second input terminals respectively coupled to the first and second signal output terminals of the signal generator, the first NAND gate also having an output terminal;

a second NAND gate, having first and second input terminals respectively coupled to the second and third output terminals of the signal generator, the second NAND gate also having an output terminal;

a third NAND gate having first and second input terminals respectively coupled to the first and third output terminals of the signal generator, the third NAND gate also having an output terminal; and a fourth NAND gate having first, second, and third input terminals respectively coupled to the output terminals of the first, second and third NAND gates, the fourth NAND gate also having an output terminal coupled to the phase-regulated-signal output terminal.

17. A phase-locked loop, comprising:

a phase detector operable to receive a clock signal having a clock frequency and an oscillator signal having an oscillator frequency and phase and operable to generate an error signal having a signal level that is proportional to the difference between the clock and oscillator frequencies; and an oscillator coupled to the phase detector and including, a signal generator operable to generate a plurality of periodic reference signals such that a majority of the reference signals have a frequency that is proportional to the signal level of the error signal; and a signal-phase discriminator coupled to the signal generator and operable to generate the oscillator signal such that the oscillator frequency and phase are the same as the frequency and phase of the majority of the periodic reference signals.

18. The phase-locked loop of claim 17 wherein the signal level of the error signal comprises a voltage level.

19. The phase-locked loop of claim 17, further comprising a frequency divider coupled to the phase detector and to the oscillator and operable to reduce the oscillator frequency of the oscillator signal and to provide the oscillator signal having the reduced oscillator frequency to the phase detector.

20. A processor, comprising:
a processing circuit operable to receive a processor clock signal having a processor-clock frequency and a processor-clock phase; and
a phase-locked loop coupled to the processing circuit and operable to receive a system clock signal having a system-clock frequency, the phase-locked loop including,
a phase detector operable to generate an error signal having a signal level that is proportional to the difference between the system-clock and processor-clock frequencies,
a signal generator coupled to the phase detector and operable to generate a plurality of periodic reference signals such that a majority of the reference signals have a frequency that is proportional to the signal level of the error signal, and
a signal-phase discriminator coupled to the signal generator and operable to generate the processor clock signal such that the processor-clock frequency and phase are the same as the frequency and phase of the majority of the periodic reference signals.

21. An electronic system, comprising:
a data input device;
a data output device; and
a computer circuit coupled to the data input and output devices and including a processor that comprises,
a processing circuit operable to receive a processor clock signal having a processor-clock frequency and a processor-clock phase, and
a phase-locked loop coupled to the processing circuit and operable to receive a system clock signal having a system-clock frequency, the phase-locked loop including,
a phase detector operable to generate an error signal having a signal level that is proportional to the difference between the system-clock and processor-clock frequencies,
a signal generator coupled to the phase detector and operable to generate a plurality of periodic reference signals such that a majority of the reference signals have a frequency that is proportional to the signal level of the error signal, and
a signal-phase discriminator coupled to the signal generator and operable to generate the processor clock signal such that the processor-clock frequency and phase are the same as the frequency and phase of the majority of the periodic reference signals.

22. A method, comprising:
generating a regulated signal having the same phase as all of a plurality of reference signals if the reference signals have the same phase as one another; and
generating the regulated signal having the same phase as a majority of the reference signals if one of the reference signals has a phase that is different from the phases of the other reference signals.

23. The method of claim 22, further comprising generating all of the reference signals having the same phase absent an event that may shift the phase of one of the reference signals with respect to the phases of the other reference signals.

24. A method, comprising:
generating three reference signals each having a respective phase, at least a majority of the reference signals having the same phase; and
generating a regulated signal having the same phase as the majority of the reference signals.

25. The method of claim 24, further comprising generating all of the reference signals having the same phase absent an occurrence that may shift the phase of one of the reference signals with respect to the other reference signals.

26. A method, comprising:
generating three reference signals having respective frequencies and phases;
equalizing the frequencies and phases of the reference signals; and
generating a regulated signal having the same frequency and phase as a majority of the reference signals if the phases of a minority of the reference signals are unequal to the phase of the majority of the reference signals.

27. The method of claim 26 wherein generating the reference signals comprises starting to generate the three reference signals simultaneously.

28. The method of claim 26 wherein generating the regulated signal comprises comparing the phases of respective pairs of the reference signals to determine the phase of the majority of the reference signals.

* * * * *